United States Patent
Jeffries et al.

(10) Patent No.: US 8,294,497 B2
(45) Date of Patent: Oct. 23, 2012

(54) LOW-OFFSET CHARGE PUMP, DUTY CYCLE STABILIZER, AND DELAY LOCKED LOOP

(75) Inventors: Brad Jeffries, Browns Summit, NC (US); Michael Elliott, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/629,634

(22) Filed: Dec. 2, 2009

(65) Prior Publication Data

US 2010/0271098 A1   Oct. 28, 2010

Related U.S. Application Data

(60) Provisional application No. 61/172,483, filed on Apr. 24, 2009.

(51) Int. Cl.
  *H03L 7/06* (2006.01)
(52) U.S. Cl. .......................... 327/157; 327/148
(58) Field of Classification Search .................. 327/148, 327/157; 375/374
See application file for complete search history.

(56) References Cited

U.S. PATENT DOCUMENTS

| | | | |
|---|---|---|---|
| 6,278,332 B1 * | 8/2001 | Nelson et al. | 331/17 |
| 6,741,110 B2 * | 5/2004 | Roisen | 327/158 |
| 6,781,425 B2 * | 8/2004 | Si | 327/148 |
| 7,432,752 B1 | 10/2008 | Lee et al. | |
| 7,439,784 B2 * | 10/2008 | Lin | 327/157 |
| 7,750,695 B2 * | 7/2010 | Caplan et al. | 327/148 |
| 2009/0243670 A1 * | 10/2009 | Draxelmayr | 327/157 |

* cited by examiner

*Primary Examiner* — Patrick O'Neill
(74) *Attorney, Agent, or Firm* — Kenyon & Kenyon LLP

(57) ABSTRACT

A charge pump circuit can include a first pair of transistors having connected sources and gates configured to receive a first pump signal and an inverse first pump signal and a second pair of transistors having connected drains and gates configured to receive a second pump signal and an inverse second pump signal, sources of the second pair of transistors being connected to drains of the first pair of transistors at first and second connection nodes, wherein the first and second pair of transistors are all of the same transistor type and provide an output current in response to the first and second pump signals. The charge pump circuit can also include a voltage stabilizer circuit connected to the second connection node and configured to regulate the second connection node to have a voltage within a predetermined range about a selectable voltage. Duty cycle stabilizers and control loops such as delay locked loops can include the charge pump circuit.

26 Claims, 6 Drawing Sheets

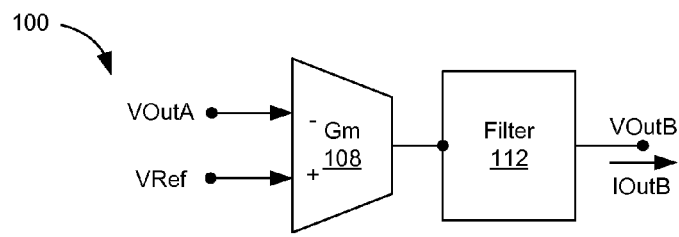
FIG. 11
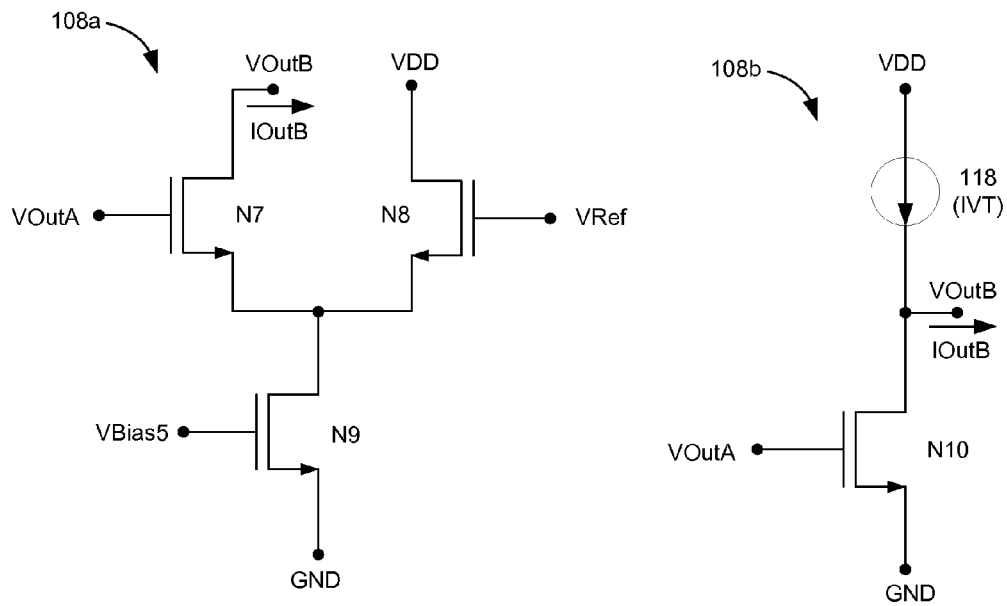
FIG. 13
FIG. 14
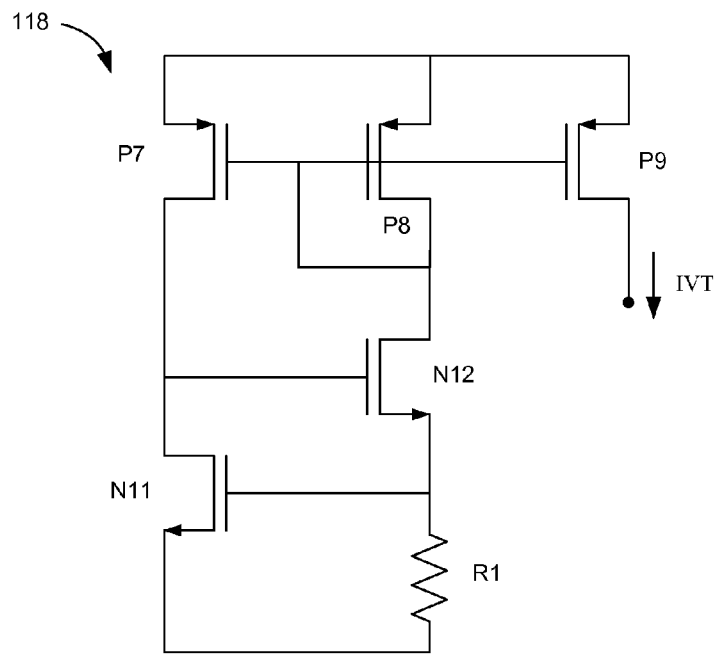
FIG. 15

_(12) United States Patent_ US 8,294,497 B2

LOW-OFFSET CHARGE PUMP, DUTY CYCLE STABILIZER, AND DELAY LOCKED LOOP

CROSS-REFERENCE TO RELATED APPLICATIONS

This application claims priority under 35 U.S.C. §119 to U.S. Provisional Patent Application No. 61/172,483, to Brad Jeffries and Michael Elliot, filed on Apr. 24, 2009, and entitled "Low-Offset Charge Pump and Control Loop Architecture," which is herein incorporated by reference in its entirety.

BACKGROUND INFORMATION

Clock signals can be used to regulate the operation of both digital and analog circuits. Analog-to-digital converters (ADCs) can utilize a clock signal to regulate the performance of conversion functions. FIG. 1 depicts an ADC 20 configured to receive an analog input signal VAnalogIn and a clock input signal VClockIn, and output a digital signal VDigitalOut. Such a converter 20 typically relies on the precision of the duty cycle of the clock signal VClockIn to allot sufficient time for internal amplifiers to settle to steady- or quasi-steady-state conditions before a new conversion cycle begins. When the duty cycle of the clock signal VClockIn is not as expected, for example because of clock jitter in which the rising or falling edge of the clock signal VClockIn is displaced in time from its expected occurrence in response to noise or other undesirable circuit effects, the performance metrics of the ADC 20 can be deleteriously affected.

Circuits requiring a clock signal can utilize a duty cycle stabilizer (DCS) to ensure the precision of the duty cycle of the clock signal. FIG. 2 depicts an embodiment of a circuit 24 including the ADC 20 and a DCS 28. The DCS 28 receives the clock in signal VCLockIn from a clock signal generator or another circuit, and produces a clock out signal VCLockOut, for use by the ADC 20, having a predetermined duty cycle. In this way, the ADC 20 can rely on the precision of the duty cycle to achieve desired performance metrics. Optionally, the DCS 28 can produce a plurality of clock out signals VClockOutA, VClockOutB, . . . VClockOutI having a plurality of different predetermined duty cycles. For example, the clock out signal VClockOut delivered to the ADC 20 may have a precise 50% duty cycle, whereas the other clock out signals VClockOutA, VClockOutB, . . . VClockOutI may have precise duty cycles of 25%, 50%, 75%, etc., or any other desired predetermined duty cycle value.

FIG. 3 depicts one embodiment of a DCS 32 for producing a clock out signal VClockOut having a predetermined duty cycle. The depicted DCS 32 includes an integrator 36, a ramp circuit 40, a Schmidt trigger 44, and an SR latch 48. In operation, a rising edge of the clock in signal VClockIn is received at the set input S of the latch 48, setting the latch 48 and producing a rising edge of the clock out signal VClockOut. The clock out signal VClockOut feeds back to the integrator 36 and the ramp circuit 40. The integrator 36 generates a substantially DC output control signal having a level indicative of the duty cycle of the clock out signal VClockOut. At the same time, the output of the ramp circuit 40 is reset by the rising edge of the clock out signal VClockOut and begins to ramp up at a rate set by the value of the output of the integrator 36. At a certain point the rising output value of the ramp circuit 40 triggers the Schmidt trigger 44. The ramp circuit 40 and Schmidt trigger 44 thus effectively act as variable delay cell that produces an output pulse to the reset input R of the SR latch 48 that resets the latch 48, producing a falling edge of the clock out signal VClockOut. The ramp circuit 40 is configured such that when the clock out signal VClockOut has the desired predetermined duty cycle, it generates an output signal that ramps at a correct rate to produce the desired duty cycle. The negative feedback action of the depicted DCS 32 regulates the clock out signal VClockOut to maintain the predetermined duty cycle. When the duty cycle of the clock out signal VClockOut is greater or less than the predetermined value, the integrator 36 produces an output signal to the ramp circuit 40 that increases or decreases the rate at which the ramp circuit 40 ramps, triggering the Schmidt trigger 44 sooner or later to producing a reset pulse to the SR latch 48 sooner or later, thereby adjusting the falling edge of the clock out signal VClockOut in a manner to return it to the predetermined duty cycle.

One problem with the DCS 32 depicted in FIG. 3 is that the integrator 36 is essentially a continuous-time circuit, integrating the clock out signal VClockOut continuously. However, in duty cycle stabilization, the primary concern is often the placement of the edges of the clock signal. Thus, the integrator 36, in integrating the entire signal, time-wise, is integrating many moments of little concern, and is thus unnecessarily susceptible to error arising during these moments of little concern. For example, noise can generally decrease the operating precision of circuits, and this effect potentially has greater impact on an integrator 36 operating continuously than a circuit which only operates during the periods of import, i.e., the edge-transition periods of the clock out signal VClockOut. Thus, the continuous-time nature of the DCS circuit 32 can limit its performance metrics.

BRIEF DESCRIPTION OF THE DRAWINGS

So that features of the present invention can be understood, a number of drawings are described below. However, that the appended drawings illustrate only particular embodiments of the invention and are therefore not to be considered limiting of its scope, for the invention may encompass other equally effective embodiments.

FIG. 11 is a circuit schematic depicting an embodiment of a voltage stabilizer of embodiments of the charge pump.

FIG. 13 is a circuit schematic depicting an embodiment of a transconductance amplifier of embodiments of the voltage stabilizer.

FIG. 14 is a circuit schematic depicting another embodiment of the transconductance amplifier of embodiments of the voltage stabilizer.

FIG. 15 is a circuit schematic depicting an embodiment of a VT-based current source of embodiments of the voltage stabilizer.

DETAILED DESCRIPTION OF EXAMPLE EMBODIMENTS

A low-offset charge pump circuit can include a first pair of transistors and a second pair of transistors. The first pair of transistors have connected sources and gates configured to receive a first pump signal and an inverse first pump signal, and the second pair of transistors have connected drains and gates configured to receive a second pump signal and an inverse second pump signal. Sources of the second pair of transistors can be connected to drains of the first pair of transistors at first and second connection nodes. The first and second pair of transistors can all be of the same transistor type, and provide an output current in response to the first and second pump signals. The charge pump circuit can include a voltage stabilizer circuit connected to the second connection node and configured to regulate the second connection node to have a voltage value falling within a predetermined range about a selectable voltage. The limiting of the voltage of the second connection node to the predetermined range about the selected voltage is one aspect that can decrease an offset of the charge pump.

Duty cycle stabilizers and control loops such as delay locked loops can include the charge pump circuit. A duty cycle stabilizer circuit can include a phase detector, the charge pump circuit, a loop filter and a delay cell. The phase detector circuit can be configured to receive a clock in signal and a clock out signal and output phase difference signals representing a phase difference between edge transitions of the clock in and clock out signals. The phase difference signals including first and second pump signals. The loop filter can be configured to receive an output current from the charge pump and produce a control voltage representing the degree of deviation of a duty cycle of the clock out signal from a predetermined duty cycle. The delay cell can be configured to generate the clock out signal having the predetermined duty cycle value according to the control signal.

Figure 1:
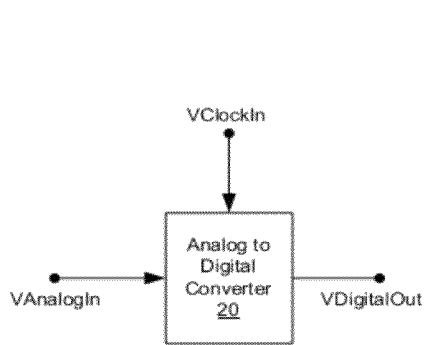
FIG. 1 is a circuit schematic depicting an embodiment of an analog-to-digital converter circuit receiving a clock in signal.
Figure 2:
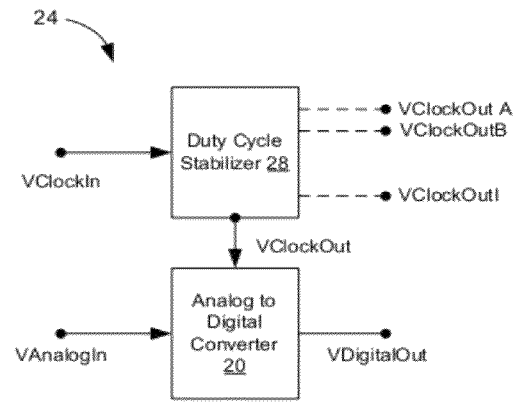
FIG. 2 is a circuit schematic depicting another embodiment of an analog-to-digital converter circuit having a duty cycle stabilizer circuit receiving a clock in signal and producing clock out signals.
Figure 3:
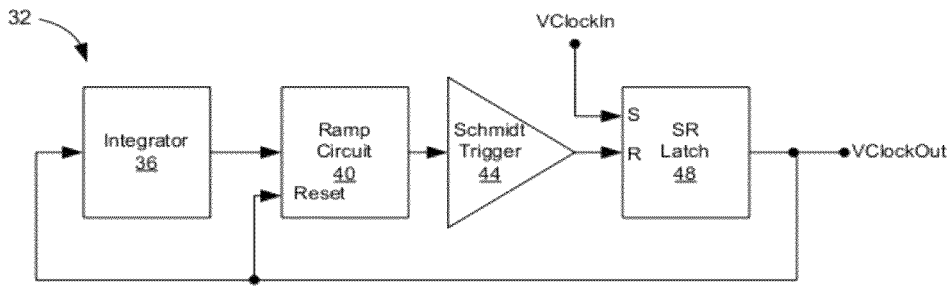
FIG. 3 is a circuit schematic depicting an embodiment of a duty cycle stabilizer including a continuous-time integrator.
Figure 4:
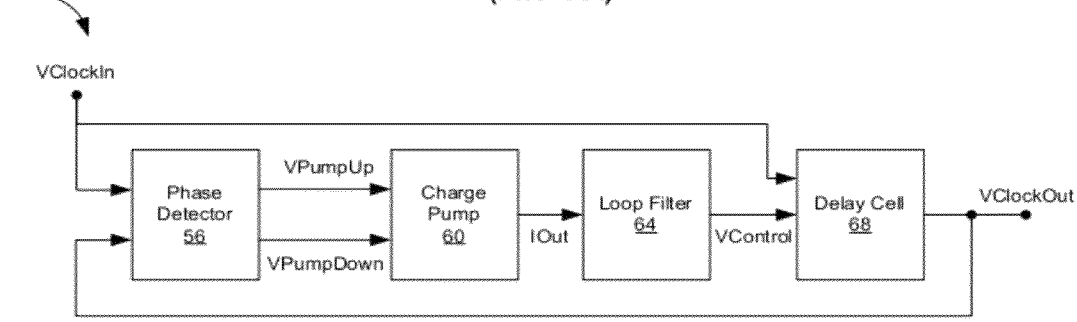
FIG. 4 is a circuit schematic depicting an embodiment of a duty cycle stabilizer implementing a delay locked loop.

FIG. 4 depicts an embodiment of a duty cycle stabilizer (DCS) 52 configured to produce a clock out signal VClockOut having a predetermined duty cycle utilizing detection of signal-transition edges instead of continuous-time integration. The depicted DCS 52 can include a phase detector 56, a charge pump 60, a loop filter 64, and a delay cell 68. The DCS 52 can be considered to implement a delay locked loop (DLL). In operation, the phase detector 56 can receive the clock in signal VCLockIn and a clock out signal VCLockOut produced by the delay cell 68, and generate phase difference signals including a pump up signal VPumpUp and a pump down signal VPumpDown, which are representative of a phase difference between the clock in signal VCLockIn and the clock out signal VCLockOut. The pump up and pump down signals VPumpUp and VPumpDown can be digital signals, as are the clock in and clock out signals VClockIn, VClockOut, and can have logic-low or logic-high asserted or unasserted states. In the following discussion, an asserted digital signal is assumed to be logic-high; however, equivalent systems can instead utilize logic-low asserted states. The phase detector 56 can activate the pump up signal VPumpUp upon receiving a rising edge of the clock in signal VClockIn before a rising edge of the clock out signal VCLockOut, and de-activate the pump up signal VPumpUp upon subsequently receiving the rising edge of the clock out signal VClockOut. In a similar manner, the phase detector 56 can activate the pump down signal VPumpDown upon receiving a rising edge of the clock out signal VClockOut before a rising edge of the clock in signal VClockIn, and de-activate the pump down signal VPumpDown upon subsequently receiving the rising edge of the clock in signal VClockIn. If both the clock in and clock out signals VClockIn, VClockOut have coincident rising edges, the phase detector 56 can not activate either of the pump up or pump down signals VPumpUp, VPumpDown. The phase detector 56 or an associated circuit can also produce inverses of the pump up and pump down signals VPumpUpBar, VPumpDownBar.

The charge pump 60 can receive the pump up and pump down signals VPumpUp, VPumpDown from the phase detector 56, and generate a predetermined output current IOut as a function of the pump up and pump down signals VPumpUp, VPumpDown. For example, in response to the assertion of the pump up signal VPumpUp, the charge pump 60 can generate the output current IOut flowing out of the charge pump 60, and in response to the assertion of the pump down signal VPumpDown, the charge pump 60 can generate the output current IOut flowing into the charge pump 60.

Figure 5:
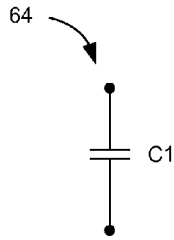
FIG. 5 is a circuit schematic depicting an embodiment of a loop filter of embodiments of the duty cycle stabilizer.

The loop filter 64 can receive the output current IOut generated by the charge pump 60 and generated a control voltage VControl as a function of the received output current IOut. The loop filter 64 can optionally be a low pass filter. FIG. 5 depicts one embodiment of the loop filter 64a, having a capacitor C1 that can connected across the output of the charge pump 60 and another circuit node, such as a power supply or ground node. The depicted loop filter 64 can receive the output current IOut at a first terminal of the capacitor C1, and, depending on whether the output current IOut is flowing into or out of the charge pump 60, the voltage at the first terminal of the capacitor C1 can increase or decrease. The control voltage VControl can be taken as the voltage at the first terminal of the capacitor C1. Other embodiments of the loop filter 64 exist, which can optionally include combinations of resistors, capacitors, transistors, etc., configured to implement a predetermined transfer function.

Figure 6:
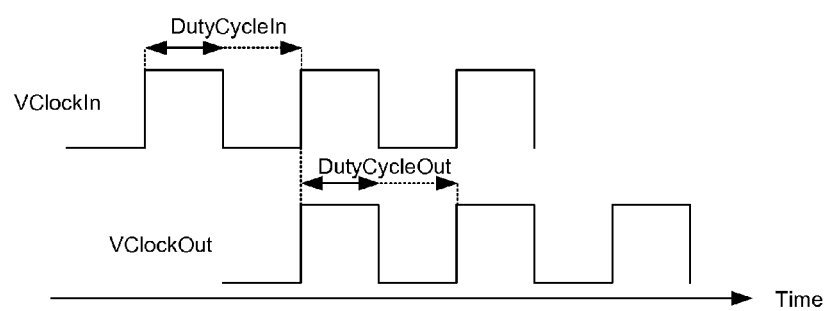
FIG. 6 depicts embodiments of clock in and clock out signals received and produced by the duty cycle stabilizer.

The delay cell 68 can receive the control signal VControl and the clock in signal VClockIn and generate the clock out signal VClockOut. The generated clock out signal VClockOut is a delayed and modified version of the clock in signal VClockIn, having a rising edge delayed and aligned to a subsequent rising edge of the clock in signal VCLockIn by the DLL action of the DCS, and having a predetermined duty cycle. FIG. 6 depicts one embodiment of the clock in and clock out signals VClockIn, VClockOut received and generated by the delay cell, respectively. As shown in FIG. 6, the delay cell 68 can generate a replica of the clock in signal VClockIn, having the same period and a rising edge aligned to a rising edge of the clock in signal VClockIn, but delayed by one clock period. In other embodiments, the implemented delay between the clock in and clock out signals VClockIn, VClockOut can be a different number of whole or fractional clock periods. The clock in signal VClockIn has a first duty cycle DutyCycleIn and the clock out signal VClockOut has a second duty cycle DutyCycleOut, as represented in FIG. 6 by the solid-line portion in comparison to the sum of the solid-line and dashed-line portions of the depicted clock periods. The DCS 52 can be configured to produce a clock out signal VClockOut having a predetermined duty cycle DutyCycle-Out from a received clock in VClockIn that potentially has a jittery, e.g., unpredictable, duty cycle DutyCycleIn.

The DLL action of the DCS 52 can produce the delayed and aligned clock out signal VClockOut from the clock in signal VClockIn. The phase detector 56 can detect the phase difference between rising edges of the clock in and clock out signals VClockOut, VClockIn and generate the pump up or pump down signals VPumpUp, VPumpDown. In response, the charge pump 60 and loop filter 64 can generate a control signal VControl, and the delay cell 68 can then generate a replica of the clock in signal VClockIn that is delayed by an amount controlled by the control voltage VControl. The DCS 52, which can implement a DLL, includes a negative feedback loop operating from the phase detector 56, to the charge pump 60, to the loop filter 64, to the delay cell 68, and back again to the phase detector 56. The feedback "error" signal is the phase difference between the rising edges of the clock in and clock out signals VClockIn, VClockOut, which is amplified by the charge pump 60, loop filter 64, and delay cell 68 to reduce the error and align the phases of the clock in and clock out signals VClockIn, VClockOut.

Figure 7:
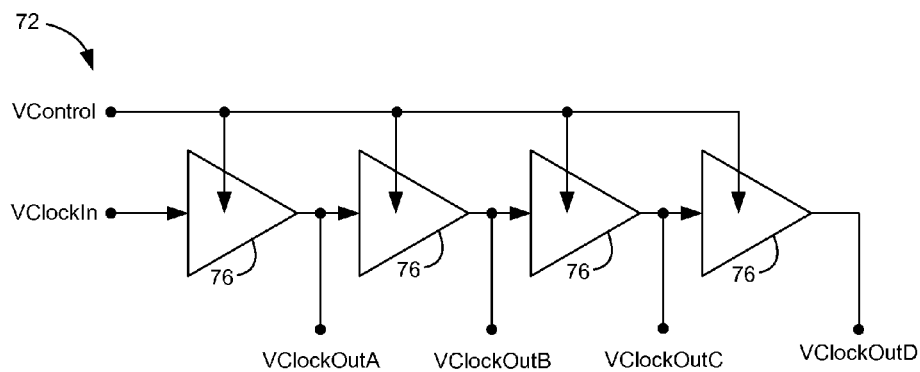
FIG. 7 is a circuit schematic depicting an embodiment of a portion of a delay cell of embodiments of the duty cycle stabilizer.
Figure 8:
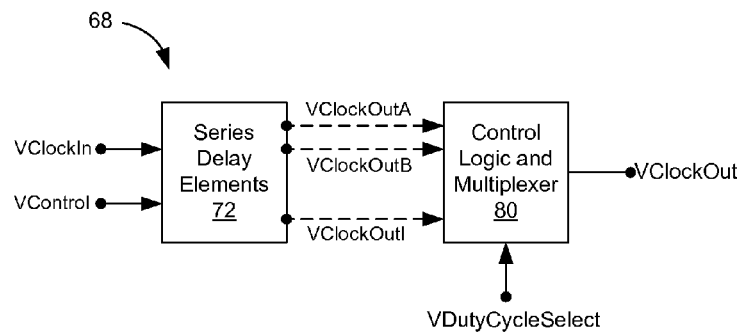
FIG. 8 is a circuit schematic depicting an embodiment of the delay cell.

FIG. 7 depicts one embodiment of a delay element chain 72 of the delay cell 68. The depicted delay element chain 72 can include a plurality of delay elements 76, each configured to receive an input signal and a control voltage and generate a delayed version of the input signal as an output, the delay based on the control voltage. The plurality of delay elements 76 can be arranged in series, the first receiving the clock in signal VClockIn, the last generating the clock out signal VClockOut, and each delay element 76, up to the penultimate in the series, feeding an output signal to the next delay element 76. The control signal VControl generated by the loop filter 64 can be fed to each of the delay elements 76 to control the amount of delay implemented by the delay element 76. Each of the delay elements 76 can output a generated clock out signal ClockOutA, . . . , ClockOutD having the same period as the clock in signal VClockIn. In one embodiment, the middle clock out signal VClockOutB depicted in FIG. 7 can be the clock out signal fed back to the phase detector 56 for operation of the DLL, and the rising edge of this clock out signal will be aligned to the succeeding rising edge of the clock in signal VClockIn. In the depicted example, because each delay element 76 can implement an equal delay, a full clock period of the clock in signal VClockIn can be measured as the time between rising edges separated by two delay elements, e.g., between VClockOutB and VClockOutD. Thus, in FIG. 7, if VClockOutB is fed back to the phase detector 56, the rising edge of the clock out signal VClockOut can be taken as the rising edge of VClockOutB and the falling edge of the clock out signal VClockOut can be taken as the rising edge of VClockOutC. FIG. 8 depicts one embodiment of the delay cell 68 having the series-connected delay element chain 72 and a control logic and multiplexer circuit 80 configured to generate the clock out signal VClockOut, having the predetermined duty cycle, from selected clock signals generated by the individual delay elements 76. The clock out signal VClockOut so generated can have a fixed predetermined duty cycle or selectable predetermined duty cycle selected based on a duty cycle selection signal VDutyCycle-Select.

Figure 9:
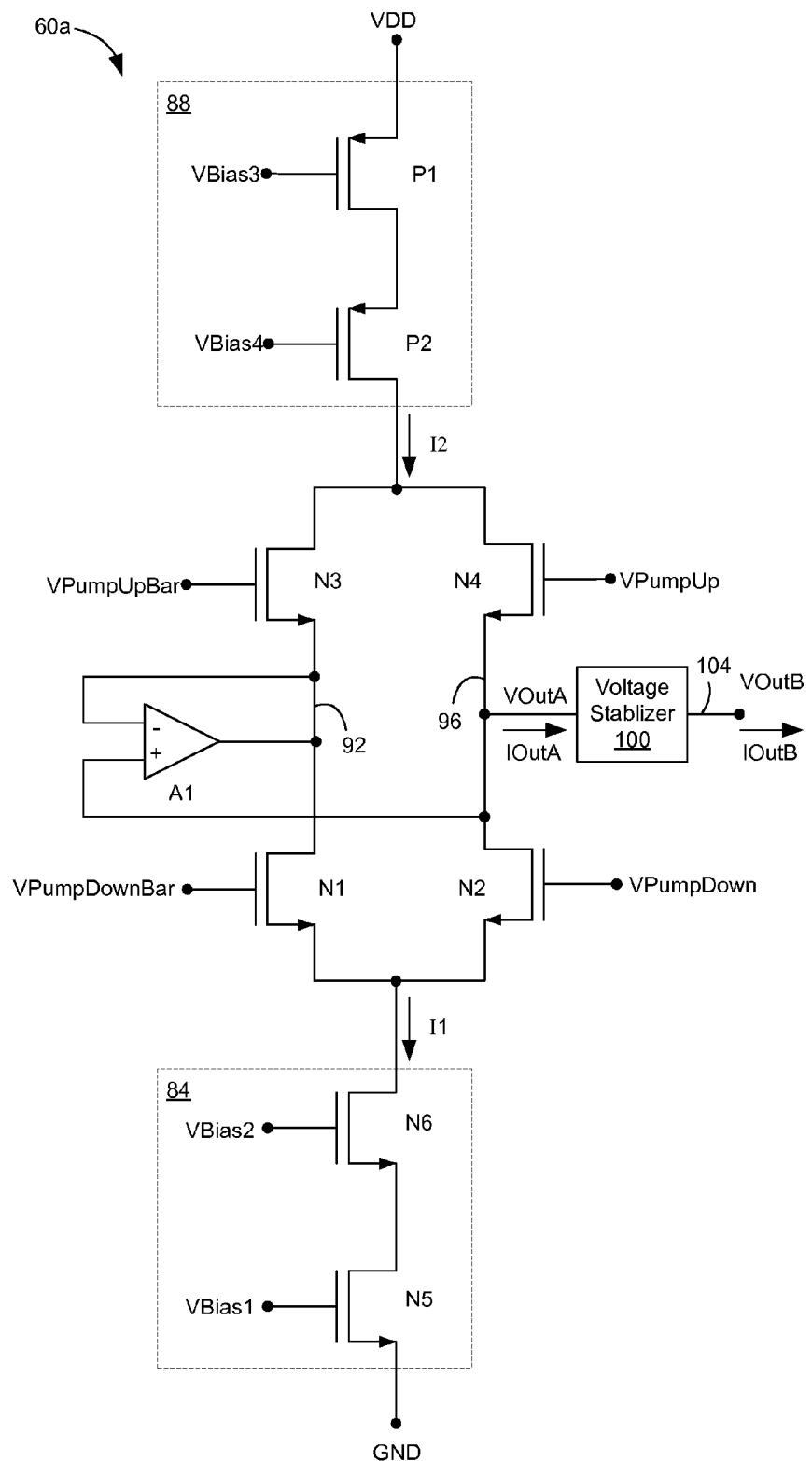
FIG. 9 is a circuit schematic depicting an embodiment of a charge pump that can be used in the duty cycle stabilizer.

FIG. 9 depicts an embodiment 60a of the charge pump 60 that can be used in the DCS 52. The depicted charge pump 60 can include first and second NMOS transistors N1, N2 arranged as a differential pair with sources connected to a first current source 84 configured to supply a first predetermined current I1 to the differential pair N1, N2. The depicted charge pump 60 can also include third and fourth NMOS transistors N3, N4 arranged with drains connected together and to a second current source 88 configured to supply a second predetermined current I2 to the third and fourth NMOS transistors N3, N4. The drains of the first and second NMOS transistors N1, N2 can be connected to the sources of the third and fourth NMOS transistors N3, N4, respectively, at first and second connection nodes 92, 96. The second connection node 96 can be regarded as an intermediate output node. The gates of the first and second NMOS transistors N1, N2 can be configured to receive the inverse of the pump down signal VPumpDownBar and the pump down signal VPumpDown, respectively. The gates of the third and fourth NMOS transistors can be configured to receive the inverse of the pump up signal VPumpUpBar and the pump up signal VPumpUP, respectively.

The first current source 84 can include fifth and sixth NMOS transistors N5, N6 connected in a cascode configuration, with the sixth NMOS transistor N6 having a drain connected to the sources of the differential pair N1, N2 and a source connected to the drain of the fifth NMOS transistor N5, the source of the fifth NMOS transistor N5 connected to a lower power supply or ground GND. The second current source 88 can include first and second PMOS transistors P1, P2 connected in a cascode configuration, with the second PMOS transistor P2 having a drain connected to the connected drains of the third and fourth NMOS transistors N3, N4 and a source connected to the drain of the first PMOS transistor P1, the source of the first PMOS transistor P1 connected to an upper power supply VDD. The gates of the fifth and sixth NMOS transistors N5, N6 and the first and second PMOS transistors P1, P2, can receive bias voltages VBias1, VBias2, VBias3, VBias4 configured to generate predetermined values of the first and second currents I1, I2.

The charge pump of FIG. 9 can also include a differential input, single-ended output amplifier A1 arranged in a negative feedback configuration, having a negative input terminal connected to the first connection node 92, a positive input terminal connected to the second connection node 96, i.e., the intermediate output node, and an output terminal connected to the first connection node 92.

The charge pump of FIG. 9 can also include a voltage stabilizer circuit 100 connected to the intermediate output node 96 and be configured to regulate the intermediate output node to have a value within a predetermine reduced voltage range about a selected voltage. The regulation of the intermediate output node 96 to fall within the predetermined voltage range is one aspect that can reduce the offset of the charge pump 60, thereby increasing performance metrics of circuits including the charge pump 60, such as the DCS 52. The voltage stabilizer 100 receives a first output current IOutA and output voltage VOutA of the charge pump 60 and produce a second output current IOutB and output voltage VOutB of the charge pump 60.

In operation, the charge pump 60 of FIG. 9 can operate exemplarily as follows. The fifth and sixth NMOS transistors can be configured to operate as the first current source 84, their gates receiving bias voltages to enable this operation, including a first bias voltage VBias1 configured to cause the fifth NMOS transistor N5 to provide the predetermined first current I1 and the second bias voltage VBias2 configured bias the sixth NMOS transistor N6 to operate in a cascode configuration relative to the fifth NMOS transistor N5. The first and second PMOS transistors P1, P2 can be configured to operate as the second current source 88, their gates receiving bias voltages to enable this operation, including the third bias voltage VBias3 configured to cause the first PMOS transistor P1 to provide the predetermined second current I2 and the third bias voltage VBias3 configured bias the second PMOS transistor P2 to operate in a cascode configuration relative to the first PMOS transistor P1. When the pump up signal VPumpUp is asserted, and the pump down signal VPumpDown is not asserted, the fourth and first NMOS transistors N4, N1 can be turned on, and the second and third NMOS transistors N2, N3 can be turned off, causing the second predetermined current I2 supplied to the third and fourth NMOS transistors N3, N4 to flow entirely through the third NMOS transistor N3 and out of the intermediate output node 96 to provide the first output current IOutA to the voltage stabilizer 100. When the pump down signal VPumpDown is asserted, and the pump up signal VPumpUp is not asserted, the second and third NMOS transistors N2, N3 can be turned on, and the first and fourth NMOS transistors N1, N4 can be turned off, causing the first predetermined current I1 supplied to the first and second NMOS transistors N1, N2 to flow entirely through the second NMOS transistor N2 and be drawn from the intermediate output node 96 as the first output current IOutA provided to the voltage stabilizer.

The amplifier A1 can be arranged in a negative feedback configuration to detect the intermediate output node voltage VOutA and regulate to impose, through negative feedback, this voltage on the first connection node 92. The negative feedback action of the amplifier A1 can reduce any offset of the charge pump 60 by working to impose identical drain voltages on each of the first and second NMOS transistors N1, N2 and identical source voltages on each of the third and fourth NMOS transistors N3, N4. A charge pump offset can result, e.g., if the first NMOS transistor N1 operates differently from the second NMOS transistor N2, possibly due to slight manufacturing differences, or the third NMOS transistor N3 operates differently from the fourth NMOS transistor N4. The negative feedback action of the amplifier A1 can reduce the charge pump offset by working to enforce the same drain voltage on each of the first and second NMOS transistors N1, N2 and the same drain voltage on each of the third and fourth NMOS transistors N3, N4, to a degree determined according to the gain and offset voltage of the amplifier A1.

The voltage stabilizer 100 can be configured to limit the voltage deviation at the intermediate output node 96 to be within a predetermined range of voltages, which can further reduce the offset of the charge pump 60. As discussed above, the charge pump 60 can be thought of as generally having an offset, which can result from deviations from expected ideal behavior in response to the pump up and pump down signals VPumpUp, VPumpDown. A charge pump offset is generally undesirable, and its presence can reduce performance measures of circuits using the charge pump 60. For example, the DCS 52 of FIG. 4 can rely upon the precise operation of the charge pump 60 to correctly implement DLL action to accurately delay the clock in signal VClockIn while producing the clock out signal VClockOut. In this context, the charge pump offset may result in a comparatively inaccurate output current IOut delivered to the loop filter 64 and control voltage VControl delivered to the delay cell 68, resulting in an inaccurately delayed clock out signal VClockOut. More specifically, the charge pump offset can result in the rising edge of the clock out signal VClockOut having an undesirable temporal offset relative to the rising edge of the clock in signal VClockIn. Without the voltage stabilizer, although the voltage at the first connection node 92 can be configured to track the voltage at the intermediate output node 96, the voltage at the intermediate output node 96 may still vary in accordance with any output current and corresponding output voltage delivered to the input of the loop filter 64 during the course of operation of the DCS 52 in FIG. 4. Such a relatively uncontrolled variation of the output voltage at the node 96 connecting the drains of the second and fourth NMOS transistors could in turn translate into an undesirable time-varying charge pump offset.

The voltage stabilizer 100 can be configured to reduce the offset of the charge pump 60 depicted in FIG. 9 by limiting the voltage at the intermediate output node 96 to be within a predetermined range of voltages, the predetermined range being reduced in size relative to a hypothetical uncontrolled variation of the output voltage without the voltage stabilizer 100 present, if, e.g., used in an application such as the DCS 52 depicted in FIG. 4. The voltage stabilizer 100 can be configured to receive the first output voltage VOutA from the intermediate output node 96 and provide the second output voltage VOutB capable of a full range of voltage swing as required by a circuit utilizing the charge pump 60, such as the DCS 52 of FIG. 4. The voltage stabilizer therefore can provide a larger voltage swing of the second output voltage VOutB at a second output node 104 than it allows at the intermediate output node 96 for the first output voltage VOutA. In this sense, the voltage stabilizer 100 can provide voltage amplification between the intermediate output node 96 and the second output node 104. Additionally, the voltage stabilization circuit 100 can be configured to provide the second output current IOutB as a function of the first output current IOutA provided at the intermediate output node 96.

The voltage stabilizer 100 of the embodiment of the charge pump 60 of FIG. 9 can also enable, or improve the operating range and usefulness of, other features of the charge pump 60. The predictable, relatively smaller voltage variation present at the intermediate output node 96 can enable or improve the operating range and usefulness of using all NMOS transistors as the first, second, third and fourth NMOS transistors N1, N2, N3, N4 of the charge pump 60, e.g., instead of using both NMOS and PMOS transistors to implement these four transistors. The potentially reduced signal headroom that may result from using third and fourth NMOS transistors N3, N4 instead of PMOS transistors can be mitigated by the effect of the reduced voltage variation of the first and second connection nodes 92, 96 enabled by the voltage stabilizer 100. The use of all NMOS transistors as the first, second, third and fourth NMOS transistors N1, N2, N3, N4 can in turn reduce the offset of the charge pump 60 due to, e.g., the likelihood of less unwanted manufacturing variations among four NMOS devices than among two NMOS and two PMOS devices. Additionally, the presence of the voltage stabilizer 100 can enable or increase the operating range and usefulness of using cascode configurations in the first and second current sources 84, 88. That is, similar to the considerations at play in using third and fourth NMOS transistors N3, N4 instead of PMOS transistors, using cascode configurations in the first and second current sources 84, 88 potentially reduces operating signal headroom. However, the reduced voltage variation at the first and second connection nodes 92, 96 enabled by the voltage stabilizer 100 helps to reduce this concern.

Figure 10:
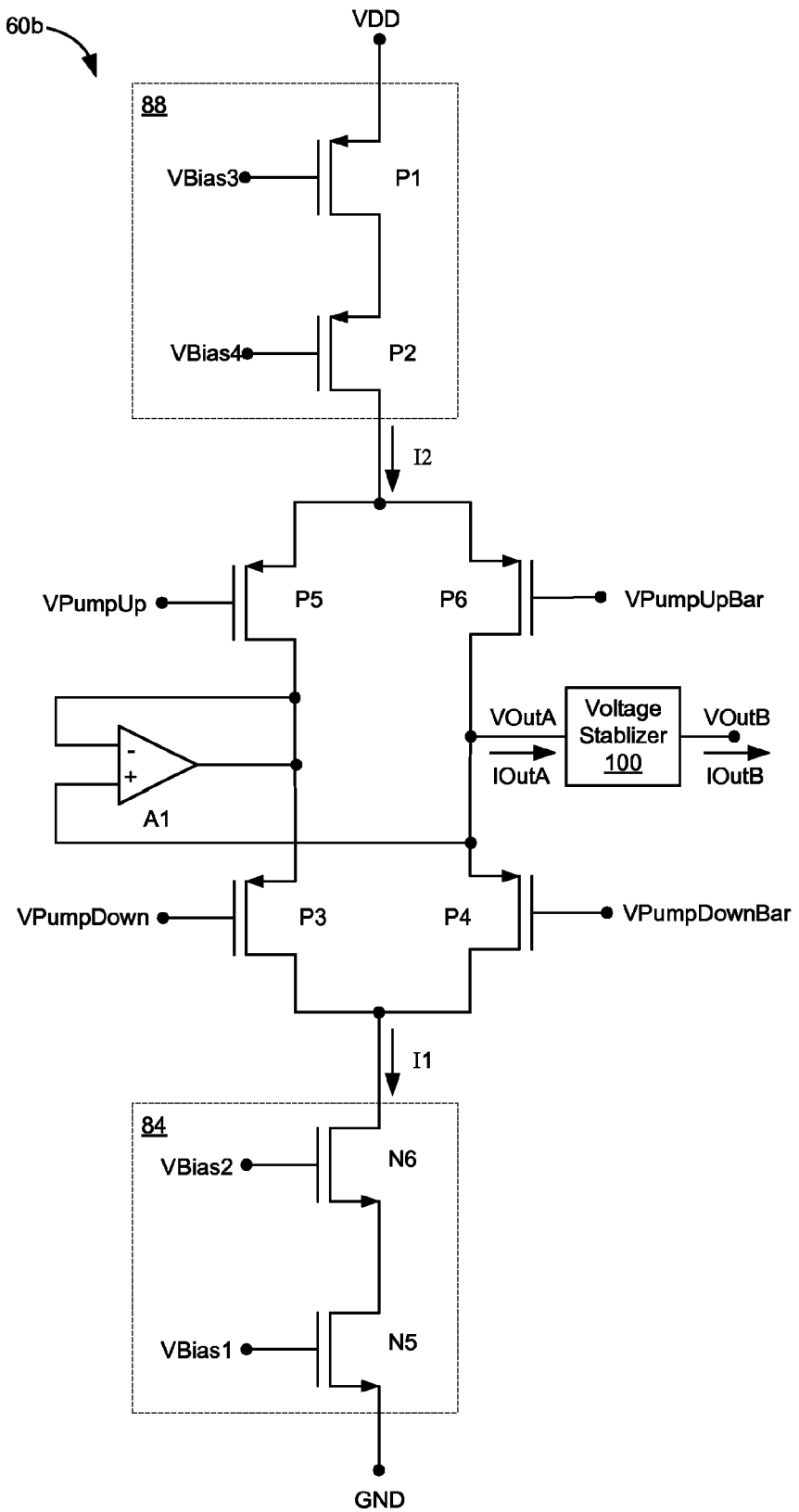
FIG. 10 is a circuit schematic depicting another embodiment of the charge pump that can be used in the duty cycle stabilizer.

Although the embodiment 60*a* of the charge pump 60 depicted in FIG. 9 includes all NMOS transistors as the central four transistors N1, N2, N3, N4 configured to receive the pump up and pump down signals VPumpUp, VPumpDown, and their inverse signals VPumpUpBar and VPumpDownBar, embodiments of the charge pump can alternatively utilize all PMOS transistors as these central four transistors. FIG. 10 depicts another embodiment 60*b* of the charge pump 60 utilizing four PMOS transistors P3, P4, P5, P6 instead of the four NMOS transistors N1, N2, N3, N4 of the embodiment 60a of FIG. 9.

FIG. 11 depicts one embodiment of the voltage stabilizer circuit 100. The depicted voltage stabilizer 100 can include a differential-input, single-ended output transconductance amplifier 108, configured to receive the first output voltage VOutA at a negative input terminal and the selectable voltage VRef at a positive input terminal, and a filter 112 connected to the transconductance amplifier 108 and configured to produce the second output voltage VOutB and output current IOutB. The filter 112 can be a low pass filter such as the filter embodiment depicted in FIG. 5. The filter 112 can optionally be realized as part of the transconductance amplifier 108. In operation, the transconductance amplification provided by the transconductance amplifier 108 provides the output voltage VOutB of the charge pump while only requiring voltage swing within the reduced predetermined voltage range at the first output voltage VOutA of the intermediate output node 96. Other embodiments of the voltage stabilizer are possible, however, that can be realized using other types of amplifiers providing any of voltage-to-voltage, current-to-current, or current-to-voltage amplification.

Figure 12:
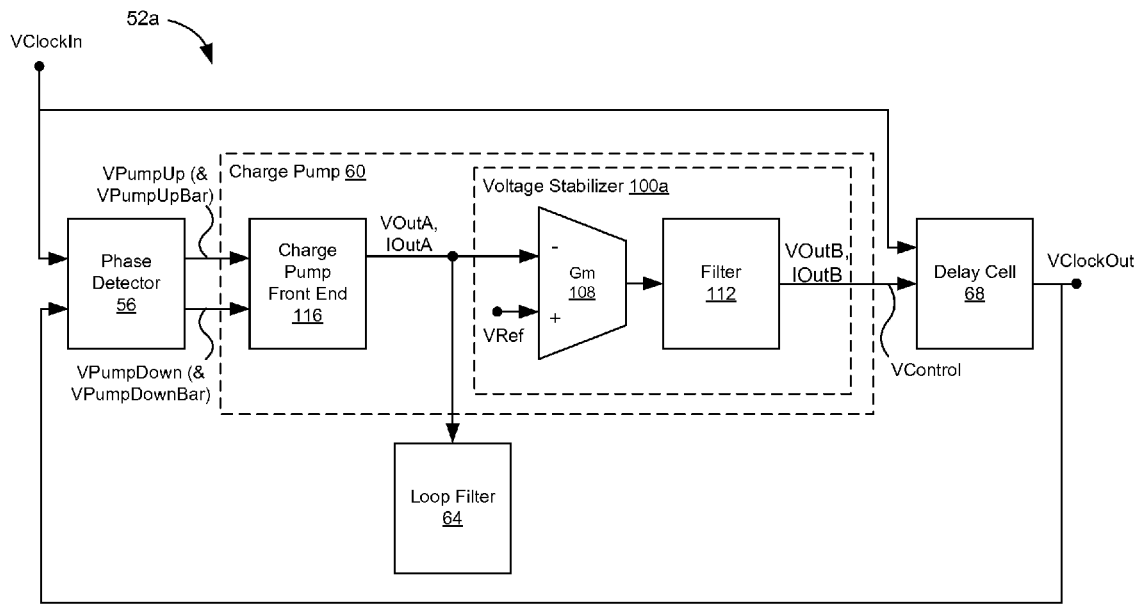
FIG. 12 is a circuit schematic depicting another embodiment of the duty cycle stabilizer.

The voltage stabilizer 100 of the charge pump 60 can be used in a negative feedback configuration, which can operate to regulate the first output voltage VOutA received at the negative input terminal of the transconductance amplifier 108 to the value of the selectable reference voltage VRef received at the positive input terminal of the transconductance amplifier 108. In this way, selection of a predetermined value of the selectable reference voltage VRef selects the voltage about which the first output voltage can be confined within the reduced predetermined voltage range. FIG. 12 depicts an embodiment 52a of the DCS 52 including the charge pump 60 having the embodiment 100a of the voltage stabilizer depicted in FIG. 11. In the depicted embodiment, the transconductance amplifier 108 can form part of a second negative feedback loop that regulates the first output voltage VOutA at the intermediate output node 96 of the charge pump 60 to the selected voltage VRef. That is, as already discussed above, the DCS includes a feedback loop that works to implement the DLL action to produce clock out signal VClockOut from a delayed version of the clock in signal VClockIn. In FIG. 12, the transconductance amplifier 108 forms part of a feedback loop that at least partially overlaps the already discussed feedback loop to regulate the first output voltage VOutA at the intermediate output node 96. This second feedback loop includes the transconductance amplifier 108 and filter 112 of the voltage stabilizer 100a, the delay cell 68, the phase detector 56, and a charge pump front end 116 (which includes all of the elements of the charge pump other than the voltage stabilizer 100). Taken together, these two feedback mechanisms of the DCS 52 can be modeled as a second order feedback system.

FIG. 13 depicts one embodiment 108a of the transconductance amplifier 108 of embodiments of the voltage stabilizer 100. The depicted transconductance amplifier 108a can include a differential pair of NMOS transistors N7, N8 configured to receive the first output voltage VOutA and the selectable reference voltage VRef, respectively, and produce the second output voltage VOutB and second output current IOutB at the drain of one of the NMOS transistors N7.

FIG. 14 depicts another embodiment 108b of the transconductance amplifier 108 of embodiments of the voltage stabilizer 100. The depicted transconductance amplifier 108b can include an NMOS transistor N10, configured to receive the first output voltage VOutA at its gate, and a current source 118 configured to provide a current IVT having a value as a function of a transistor threshold voltage VT (e.g., an NMOS threshold voltage VTN) of a process used to fabricate the circuit. The use of the threshold-voltage-based current source 118 effectively combines the reference voltage VRef and transconductance amplifier 108 into one circuit. In FIG. 14, NMOS transistor N10 effectively acts as the reference voltage VRef, and thus eliminates the need for a separate input terminal for the selected reference voltage VRef. The current source 118 also provides stability over process, voltage and temperature variations. FIG. 15 depicts one embodiment of the threshold-voltage-based current source 118, which can include NMOS transistors N11, N12, PMOS transistors P7, P8, P9, and a resistor R1.

Figure 16:
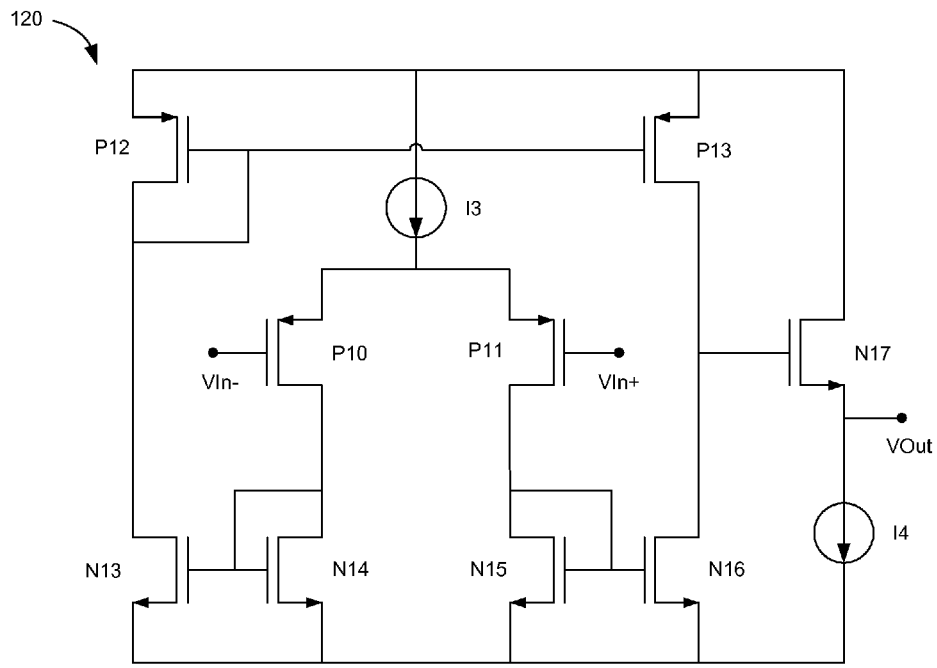
FIG. 16 is a circuit schematic depicting an embodiment of an amplifier of embodiments of the charge pump.

FIG. 16 depicts an embodiment of an amplifier 120 than can be used to implement the amplifier A1 of embodiments of the charge pump 60. The depicted amplifier 120 can include NMOS transistors N13, N14, N15, N16, N17, PMOS transistors P10, P11, P12, P13, current sources 13, 14, input terminals VIn+, VIn−, and an output terminal VOut.

Embodiments of the charge pump 60 can be used in any DLL or other control circuit implementing a control loop in addition to use in the DCS 52 discussed herein.

Additional embodiments of the charge pump 60 and DCS 52 are possible, which can be the result of variously combining portions of or entire embodiments of the charge pump 60 and DCS 52 described herein. For example, any feature of any of the embodiments of the charge pump 60 and DCS 52 described herein can optionally be used in any of the other embodiments of the charge pump 60 and DCS 52 described herein. The operation of circuit embodiments discussed herein is exemplary. The charge pump 60 and DCS 52, as described herein may be operated, e.g., according to different bias regimes, signal composition, etc., and still retain functionality and usefulness.

What is claimed is:

1. A charge pump circuit, comprising:
    a first pair of transistors, having sources connected together and respective gates to receive a respective one of a first pump signal and an inverse first pump signal;
    a second pair of transistors, having drains connected together and respective gates to receive a respective one of a second pump signal and an inverse second pump signal, the second pair of transistors being connected to the first pair of transistors at first and second connection nodes;
    a voltage stabilizer circuit, connected to the second connection node to regulate the second connection node to have a voltage within a predetermined range about a selectable voltage, the voltage stabilizer including a transconductance amplifier having a transistor with a gate connected to the second connection node and a drain connected to a current source, the current source producing a current to regulate a voltage at the transistor gate to fall within the predetermined range about the selectable voltage; and
    a voltage amplifier, arranged in a negative feedback configuration, having first and second inputs connected to the first and second connection nodes and an output connected to the first connection node, to regulate the voltage at the first connection node to track the voltage at the second connection node.

2. The charge pump circuit of claim 1, further comprising:
    a first current source providing a first current to the connected sources of the first pair of transistors, including a first pair of current-source transistors connected in a cascode configuration to the connected sources of the first pair of transistors; and a second current source providing a second current to the connected drains of the second pair of transistors, including a second pair of current-source transistors connected in a cascode configuration to the connected sources of the second pair of transistors.

3. The charge pump circuit of claim 2, wherein the first pair of current source transistors are NMOS transistors and the second pair of current source transistors are PMOS transistors.

4. The charge pump circuit of claim 1, wherein the voltage stabilizer includes a transconductance amplifier having a negative input terminal connected to the second connection node and a positive input terminal connected to the selectable voltage.

5. The charge pump circuit of claim 4, wherein the voltage stabilizer is configured to regulate the second connection node using negative feedback to have a voltage that tracks the selectable voltage at the positive input of the transconductance amplifier.

6. The charge pump circuit of claim 1, wherein the first and second pair of transistors are NMOS transistors.

7. The charge pump circuit of claim 1, wherein the first and second pair of transistors are PMOS transistors.

8. The charge pump circuit of claim 1, wherein the first and second pump signals include pump up and pump down signals, wherein the voltage stabilizer circuit provides the output current flowing out of the output node in response to the pump up signal and the output current drawn into the output node in response to the pump down signal.

9. The charge pump circuit of claim 1, wherein a source of a first of the second pair of transistors is connected to a drain of a first of the first pair of transistors at the first connection node and a source of a second of the second pair of transistors is connected to a drain of a second of the first pair of transistors at the second connection node.

10. A duty cycle stabilizer circuit including the charge pump circuit of claim 1.

11. A delay locked loop circuit including the charge pump circuit of claim 1.

12. The charge pump circuit of claim 1, further comprising a loop filter connected to the second connection node, wherein the loop filter includes a capacitor connected between the second connection node and at least one of ground and a bias voltage.

13. The charge pump circuit of claim 1, wherein the transconductance amplifier current source produces a current as a function of a threshold voltage of a MOS transistor.

14. The charge pump circuit of claim 1, wherein the voltage stabilizer regulates the voltage amplitude of the second connection node as part of a feedback loop including the first and second pairs of transistors, a delay cell, and a phase detector.

15. A duty cycle stabilizer circuit, comprising:
a phase detector circuit configured to receive a clock in signal and a clock out signal and output phase difference signals representing a phase difference between edge transitions of the clock in and clock out signals, the phase difference signals including first and second pump signals;
a charge pump circuit to receive the phase difference signals and output a current as a function thereof, the charge pump circuit including:
a first pair of transistors, having sources connected together and respective gates to receive a respective one of the first pump signal and an inverse first pump signal;
a second pair of transistors, having drains connected together and respective gates to receive a respective one of the second pump signal and an inverse second pump signal, sources of the second pair of transistors being connected to drains of the first pair of transistors at first and second connection nodes, wherein the first and second pair of transistors are all of the same transistor type and provide an output current in response to the first and second pump signals; and
a voltage stabilizer circuit connected to the second connection node to regulate the second connection node to have a voltage amplitude within a predetermined range about a selectable voltage, the voltage stabilizer including a transconductance amplifier having a transistor with a gate connected to the second connection node and a drain connected to a current source, the current source producing a current to regulate a voltage at the transistor gate to fall within the predetermined range about the selectable voltage; and
a voltage amplifier, arranged in a negative feedback configuration, having first and second inputs connected to the first and second connection nodes and an output connected to the first connection node, to regulate the first connection node to track the voltage at the second connection node;
a loop filter to receive the output current from the charge pump and produce a control voltage representing the degree of deviation of a duty cycle of the clock out signal from a predetermined duty cycle; and
a delay cell to generate the clock out signal having the predetermined duty cycle value according to the control signal,
wherein the voltage stabilizer regulates the second connection node to have the voltage amplitude within the predetermined range about the selectable voltage as part of a feedback loop including the delay cell, the phase detector circuit, and the charge pump circuit.

16. The duty cycle stabilizer circuit of claim 15, the charge pump circuit further comprising:
a first current source providing a first current to the connected sources of the first pair of transistors, including a first pair of current-source transistors connected in a cascode configuration to the connected sources of the first pair of transistors; and
a second current source providing a second current to the connected drains of the second pair of transistors, including a second pair of current-source transistors connected in a cascode configuration to the connected sources of the second pair of transistors.

17. The duty cycle stabilizer circuit of claim 16, wherein the first pair of current source transistors are NMOS transistors and the second pair of current source transistors are PMOS transistors.

18. The duty cycle stabilizer circuit of claim 15, wherein the voltage stabilizer includes a transconductance amplifier having a negative input terminal connected to the second connection node and a positive input terminal connected to the selectable voltage.

19. The duty cycle stabilizer circuit of claim 18, wherein the voltage stabilizer is configured to regulate the second connection node using negative feedback to have a voltage that tracks the selectable voltage at the positive input of the transconductance amplifier.

20. The duty cycle stabilizer circuit of claim 15, wherein the first and second pair of transistors are NMOS transistors.

21. The duty cycle stabilizer circuit of claim 15, wherein the first and second pair of transistors are PMOS transistors.

22. The duty cycle stabilizer circuit of claim 15, wherein the first and second pump signals include pump up and pump down signals, wherein the voltage stabilizer circuit provides the output current flowing out of the output node in response to the pump up signal and the output current drawn into the output node in response to the pump down signal.

23. The duty cycle stabilizer circuit of claim 15, wherein a source of a first of the second pair of transistors is connected to a drain of a first of the first pair of transistors at the first connection node and a source of a second of the second pair of transistors is connected to a drain of a second of the first pair of transistors at the second connection node.

24. A charge pump circuit, comprising:
a first pair of transistors, having sources connected together and respective gates to receive a respective one of a first pump signal and an inverse first pump signal;
a second pair of transistors, having drains connected together and respective gates to receive a respective one of a second pump signal and an inverse second pump signal, sources of the second pair of transistors being connected to drains of the first pair of transistors at first and second connection nodes, wherein the first and second pair of transistors are all of the same transistor type and provide an output current in response to the first and second pump signals; and
a voltage stabilizer circuit connected to the second connection node to regulate the second connection node to have a voltage within a predetermined range about a selectable voltage, wherein the voltage stabilizer includes a transconductance amplifier having a transistor having a gate connected to the second connection node and a drain connected to a current source, wherein the current source produces a current as a function of a threshold voltage of a MOS transistor.

25. The charge pump circuit of claim 24, further comprising a loop filter connected to the second connection node, wherein the loop filter includes a capacitor connected between the second connection node and at least one of ground and a bias voltage.

26. The charge pump circuit of claim 24, further comprising a voltage amplifier, arranged in a negative feedback configuration, having an input connected to and receiving the voltage at the second connection node and an output connected to and regulating the voltage at the first connection node to track the voltage at the second connection node.

* * * * *